United States Patent
Mickievicz et al.

(10) Patent No.: US 9,466,975 B2
(45) Date of Patent: Oct. 11, 2016

(54) BASE ELEMENT AND SURGE PROTECTION SYSTEM

(71) Applicant: PHOENIX CONTACT DEVELOPMENT AND MANUFACTURING, INC., Middletown, PA (US)

(72) Inventors: Scott Keith Mickievicz, Elizabethtown, PA (US); Jon Alan Fortuna, Mechanicsburg, PA (US); Christopher Jon Laubach, Marietta, PA (US); Michael Timothy Sykes, Harrisburg, PA (US); Shane William Wiest, Shermans Dale, PA (US)

(73) Assignee: Phoenix Contact Development and Manufacturing, Inc., Middletown, PA (US)

( * ) Notice: Subject to any disclaimer, the term of this patent is extended or adjusted under 35 U.S.C. 154(b) by 110 days.

(21) Appl. No.: 14/255,522

(22) Filed: Apr. 17, 2014

(65) Prior Publication Data
US 2014/0313631 A1    Oct. 23, 2014

Related U.S. Application Data

(60) Provisional application No. 61/813,888, filed on Apr. 19, 2013.

(51) Int. Cl.
*H02H 9/00* (2006.01)
*H02H 7/20* (2006.01)
*H01T 4/06* (2006.01)

(52) U.S. Cl.
CPC ............... *H02H 9/005* (2013.01); *H01T 4/06* (2013.01)

(58) Field of Classification Search
CPC ............ H02H 7/20; H02H 9/005; H01T 4/06
USPC .......................................................... 361/118
See application file for complete search history.

(56) References Cited

U.S. PATENT DOCUMENTS

| | | | |
|---|---|---|---|
| 8,730,639 B1 | 5/2014 | Wilson et al. | |
| 2012/0081827 A1* | 4/2012 | Gillespie | H01R 9/2433 361/118 |
| 2012/0206848 A1 | 8/2012 | Gillespie et al. | |
| 2014/0204496 A1* | 7/2014 | Martinez Sanchez | H01T 4/06 361/119 |

FOREIGN PATENT DOCUMENTS

WO    2012/047383 A2    4/2012

* cited by examiner

*Primary Examiner* — Thienvu Tran
*Assistant Examiner* — Kevin J Comber
(74) *Attorney, Agent, or Firm* — McNees Wallace & Nurick LLC

(57) ABSTRACT

A base element and a surge protection system incorporating the base element are provided. The base element includes a housing having a front portion and a rear portion. Apertures in the rear portion provide access to contacts secured within the housing, and a receiving portion extending from the front portion includes at least one receiving section for receiving a surge protection cartridge. Plug receptacles in the receiving portion are in electrical communication with the contacts to incorporate the surge protection device in a circuit when the surge protection cartridge is inserted. The base element is configured to mount orthogonally to a case such that conductors secured to the contacts extend through the apertures and into an enclosure defined by the case in a substantially linear direction. The system includes a case configured to be attached to a rack mount system and a plurality of base elements secured to the case.

12 Claims, 12 Drawing Sheets

BASE ELEMENT AND SURGE PROTECTION SYSTEM

CROSS-REFERENCE TO RELATED APPLICATION

This application claims the benefit of and priority to U.S. Provisional Patent Application Ser. No. 61/813,888 entitled "ORTHOGONAL DIN RAIL BASE ELEMENT" filed on Apr. 19, 2013, which is hereby incorporated by reference in its entirety.

FIELD OF THE INVENTION

The present invention is directed to a base element and a surge protection system incorporating the base element. More particularly the present invention is directed to a base element for receiving conductors through a rear aperture and a surge protection system incorporating the base element.

BACKGROUND OF THE INVENTION

In certain markets, data centers employ various rack-mounted systems contained within an enclosure that mounts to a preconfigured frame, such as a US standard 19" or 23" rack. The 19-inch (48.26 cm) or 23-inch (58.42 cm) dimension refers to the width of the equipment mounting frame in the rack, i.e. the width of the equipment that can be mounted inside the rack. A rack unit, U or RU, is a unit of measure used to describe the height of equipment intended for mounting in these racks. One rack unit is 1.75 inches (44.45 mm) high. These systems have an excellent functional density envelope. Their user interface is in the front and their wiring interface can be in the front or the back. Once the subsystems are installed in the field, there is little reason to move them and the wiring in the back can be left closed to public access.

One element often included in rack mounted data center systems is a surge protection system. For surge protective devices (SPDs) that mount in a rack system, there is little need for functional interface or wiring in comparison to the size of the individual SPD devices. The enclosure can be dense inside with a small cross section in the rack. While SPDs can provide years of service without failure, they do eventually wear out or may need to be serviced after a surge event. In those situations, the typical system needs to be replaced by disconnecting all wires or removing internal subassemblies. These approaches may require the larger data center system to be shut down or left unprotected during service.

In rack mount environments, standard equipment practice has become the use of a surge protection system that contains multiple SPDs using an enclosure that is two RU high and offering twelve remote radio head (RRH) protection. In one approach, replacement or service of the SPDs includes pulling a drawer out of the rack mount enclosure to give access to the parts. This is complicated and presents multiple places and modes for failure.

Alternatively, certain commercially available surge protection solutions are DIN rail mounted and pluggable. Pluggable DIN rail SPDs can be mounted in the front panel of the enclosure where they can be repaired without removing anything except the failed device. This has many benefits including ease of mounting, flexibility and user reparability without unwiring. For permanent installations and control cabinets, this design is well suited where the DIN rail can be screwed to the back-plate and there is ample room to manage wiring around it.

However, the use of current DIN rail mounted pluggable surge protection in rack mount applications has heretofore been somewhat unsatisfactory in light of shortcomings as it relates to their ability to be used in conjunction with what has become the standard equipment practice for rack mount applications as previously described (i.e. 2 RU, 12 RRH).

A typical DIN rail SPD base requires substantial space to the sides for wiring which limits device density. DIN rail assemblies that are not directly on the back plate also require supplementary support structure to mount the DIN rail. This can further obstruct wiring channels and add cost. As a result of these space requirements, the ability to provide 12 RRH protection in conjunction with pluggable SPD protection has generally been limited to units having a height of 3 RU or higher; alternatively, known efforts to meet a 2 RU height has heretofore been limited to 6 RRH protection (see FIG. 1). In each case, a significant mechanical stress is still placed on the connecting wires, which are bent at an approximately right angle as they leave the enclosure and enter into the base element (see FIG. 2).

The function of an SPD is to give a path to ground for high-energy overvoltages. These can couple to adjacent conductors when laid across one another. Remote function indication circuits available on some devices can be used, but connecting them around the conductors that are being surge protected offers a place for a surge to couple to an unprotected conductor that is part of the function monitoring circuit.

A rack mount system with improvements in the process and/or the properties of the components formed would be desirable in the art.

BRIEF DESCRIPTION OF THE INVENTION

Exemplary embodiments are directed to base elements of a pluggable surge protection device that include apertures and contacts for receiving and securing conductors from an interior of an enclosure defined by a case of a rack mount system in a substantially linear manner.

In one embodiment, a base element of a pluggable surge protection device comprises a housing including a front portion and a rear portion. Apertures in the rear portion provide access to contacts secured within the housing, and a receiving portion extending from the front portion includes at least one receiving section for receiving a surge protection cartridge. Plug receptacles in the receiving portion are in electrical communication with the contacts to incorporate the surge protection device in a circuit when the surge protection cartridge is inserted. The base element is configured to mount orthogonally to a case such that conductors secured to the contacts extend through the apertures and into an enclosure defined by the case in a substantially linear direction from the rear portion.

In another embodiment, the housing of the base element includes either a 2 RU housing or a 1 RU housing for mounting to a 2 RU or a 1 RU case, respectively.

In another embodiment, a rack mount surge protection system includes a case configured to be attached to a rack mount system and a plurality of base elements of a pluggable surge protection device secured to the case. Each of the base elements comprises contacts within the base element for securing conductors therein, and apertures in a rear portion of the base element to provide access to the contacts. The conductors are directed from an interior of an enclosure defined by the case through the apertures and into the contacts in a substantially linear manner.

An advantage of exemplary embodiments is that the apertures in the rear portion of the base element provide a more compact arrangement that permits an increased density of the base elements to be incorporated in a case having a reduced height.

Another advantage of exemplary embodiments is the ability to direct conductors from the enclosure into the contacts within the base elements in a substantially linear direction.

Yet another advantage of exemplary embodiments is a reduction of stress on the wires extending from the conductors.

Still another advantage of exemplary embodiments is an ability to incorporate 24 receiving sections, or 12 RRH protection, in an enclosure having a height of 2 RU.

Another advantage of exemplary embodiments is an ability to incorporate 12 receiving sections in an enclosure having a height of 1 RU.

Yet another advantage of exemplary embodiments is an ability to view the surge protection cartridges from and/or through the front of the case.

Still another advantage of exemplary embodiments is that the base element may be configured to permit function monitor wiring to be easily routed in a manner that isolates it from conductors carrying power.

Another advantage of exemplary embodiments is an ability to easily mount the base element to the case with a DIN rail mount that provides strong support to resist later forces, such as those applied during plugging and unplugging of the surge protection cartridge.

Yet another advantage of exemplary embodiments is that the plug receptacles may be connected to one of the contacts in common to provide line-to-neutral and/or neutral-to-ground protection.

Still another advantage of exemplary embodiments is that the base elements provide significantly easier assembly.

Other features and advantages of the present invention will be apparent from the following more detailed description of the preferred embodiment, taken in conjunction with the accompanying drawings which illustrate, by way of example, the principles of the invention.

Exemplary embodiments are directed to base elements that meet these needs.

BRIEF DESCRIPTION OF THE DRAWINGS

Wherever possible, the same reference numbers will be used throughout the drawings to represent the same parts.

DETAILED DESCRIPTION OF THE INVENTION

Provided in accordance with exemplary embodiments are pluggable surge protection devices (SPDs) that can be used in conjunction with standard rack mount equipment practices through the use of a base element that is configured to receive conductors through apertures in a rear portion, doubling the current SPD density for a rack mount surge protection system.

Figure 3:
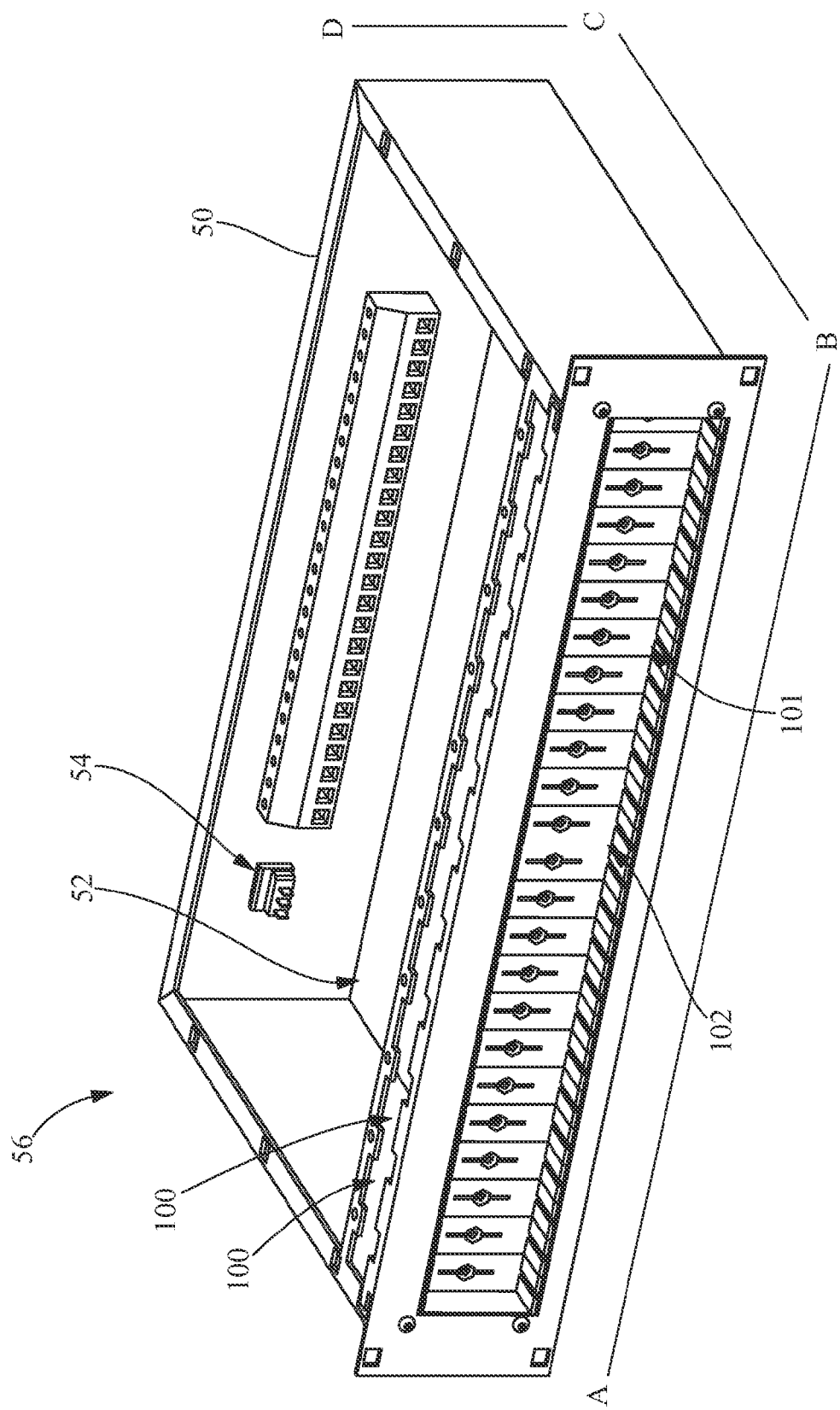
FIG. 3 illustrates a perspective view of a 2 RU enclosure according to an embodiment of the disclosure.

As shown in FIG. 3, a rack mount surge protection device (SPD) system 56 includes a case 50 having a width (A-B), a depth (B-C), and a height (C-D) defining an enclosure 52. In one embodiment, the case 50 includes a base element 100 secured thereto. In a further embodiment, as illustrated in FIG. 3, a plurality of the base elements 100 are secured within the case 50 having a width of 19" and a height of 2 rack units (RU), reflecting the manner in which exemplary embodiments of the invention can be arranged to provide pluggable surge protection while also meeting standard rack mount equipment practice.

Referring to FIGS. 4-12, the base element 100 includes a receiving portion 110 (shown empty in FIGS. 6, 8-9, and 12A-12B), and a 2 RU housing 116 configured to be secured within the 2 RU height of the case 50. At least one surge protection cartridge 200 is removably inserted within the receiving portion 110 to form a SPD 10. The surge protection cartridge 200 may be any suitable surge protection cartridge for use in a pluggable SPD system, including those commercially available from Phoenix Contact of Middletown, Pa.

In one embodiment, the receiving portion 110 includes protrusions that extend through a faceplate of the case 50 to support the base element 100, for example, as the surge protection cartridge 200 is inserted or removed. In a further embodiment, the surge protection cartridge 200 inserted in the receiving portion 110 extends past the protrusions and is visible for service from and/or through the front of the case 50. The surge protection cartridge 200 extending through the faceplate of the case 50 provides increased access for insertion and removal of the surge protection cartridge 200.

Figure 5:
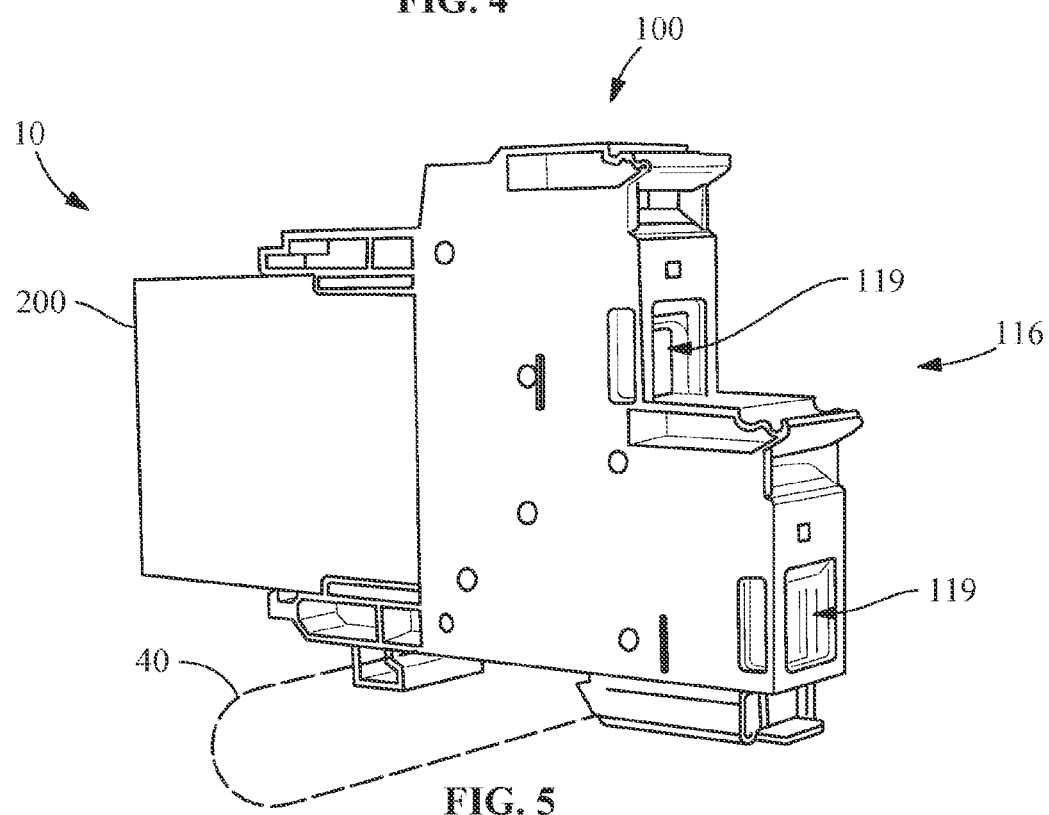
FIG. 5 illustrates a rear perspective view of the single wide base element of FIG. 4.

A DIN rail receptacle 120 of the base element 100 is configured to permit the base element 100 to be mounted orthogonally on a DIN rail 40, as shown in FIG. 5. The DIN rail 40 is incorporated into the case 50 for providing the rack mounted SPD system 56 in accordance with exemplary embodiments. In one embodiment, the DIN rail 40 is positioned on the bottom of the case 50 to allow easy mounting and retention of the base element 100.

Figure 4:
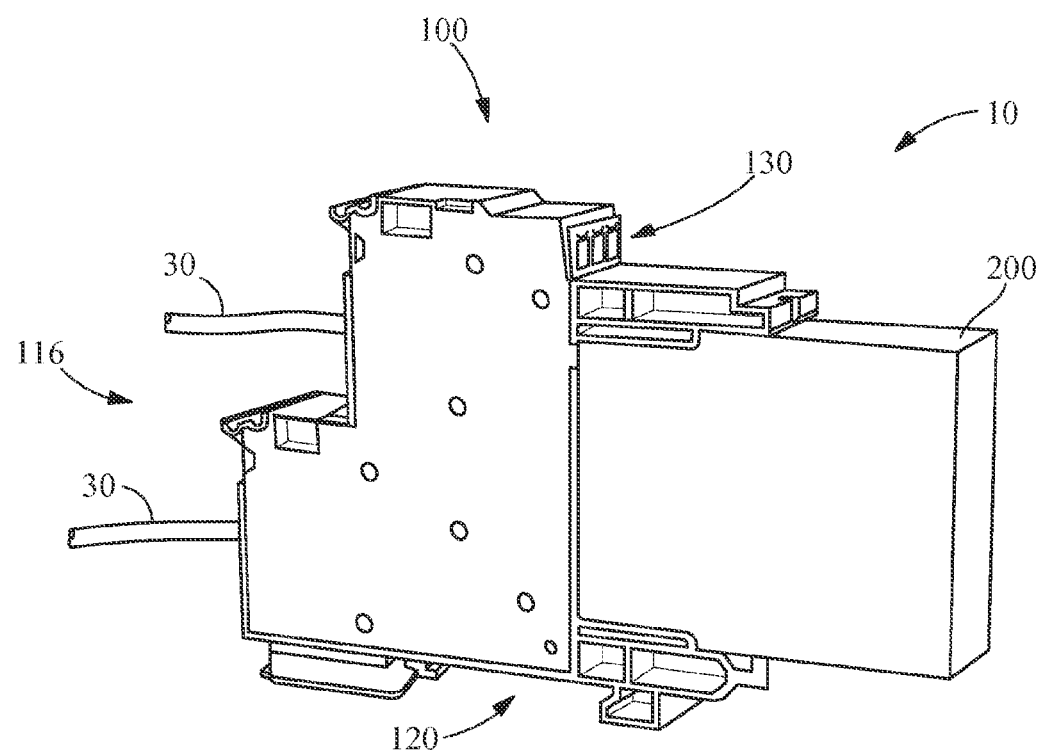
FIG. 4 illustrates a front perspective view of a single wide base element.
Figure 6:
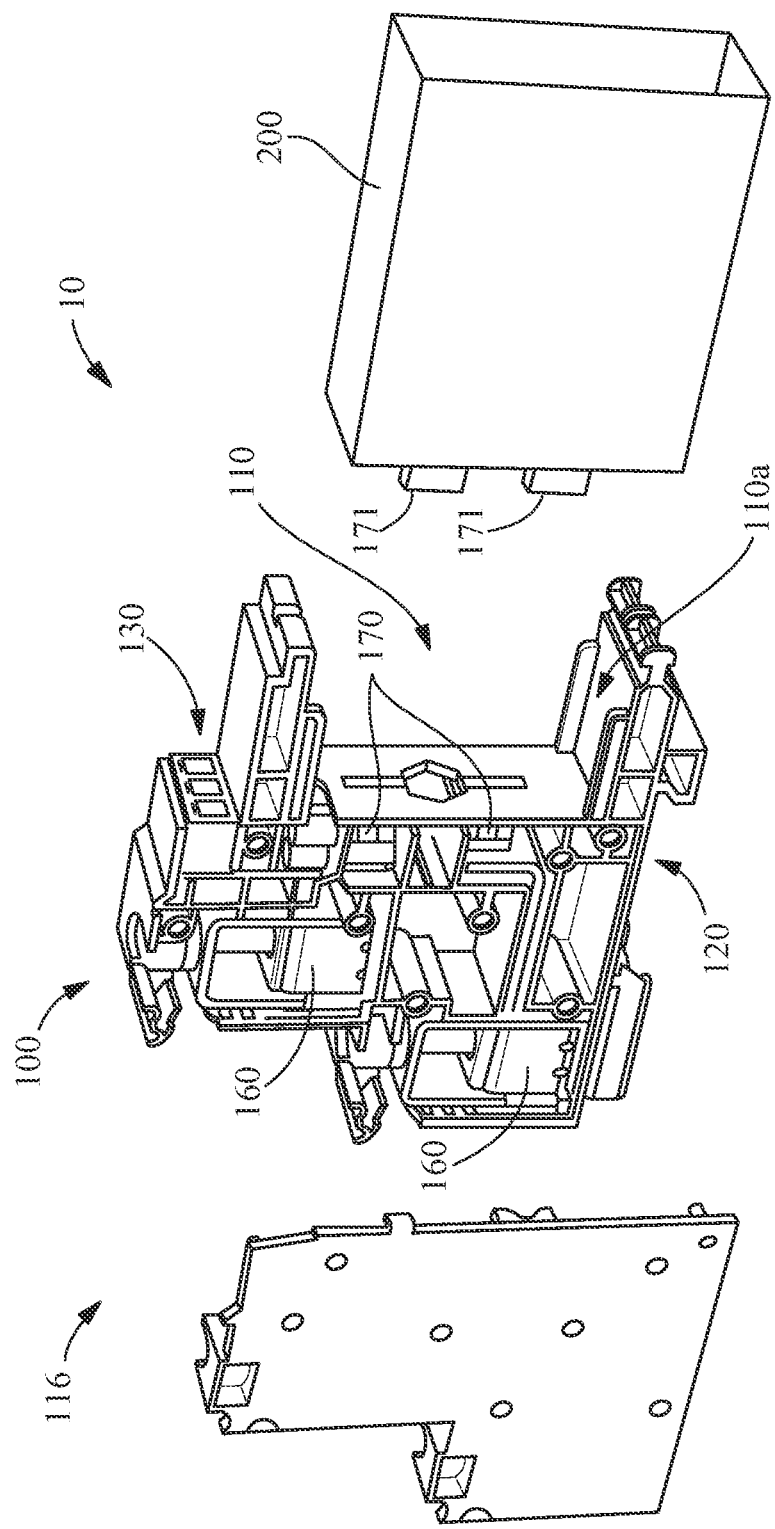
FIG. 6 illustrates an exploded front perspective view of the single wide base element of FIG. 4.

As shown in FIGS. 4-6, in one embodiment, the base element 100 is a single wide base element 100 (designated with reference number 101 in FIG. 3 to differentiate it from a double wide base element illustrated as 102). The receiving portion 110 of the single wide base element 100 includes a first receiving section 110*a* for removably receiving the surge protection cartridge 200 therein. When the single wide base element 100 is orthogonally mounted to the DIN rail 40, the first receiving section 110*a* is oriented to receive a single cartridge along the 2 RU height of the case 50. Referring to FIGS. 5 and 6, the rear of the single wide base element 100 includes conductor apertures 119 that provide access to contacts 160 within the base element 100. The contacts 160 are secured within the base element 100, for example, by attaching them to one or more housing elements. Wire conductors 30 (shown in FIG. 4 but omitted here for clarity), which carry electricity to connect the SPD 10 to a circuit to be protected, are directed into the conductor apertures 119. Once the wire conductors 30 are directed into the conductor apertures 119, the contacts 160 receive and secure the wire conductors 30 therein. The contacts 160 include any suitable article for receiving and securing the wire conductors 30 therein, such as, but not limited to, a rising cage clamp.

As best seen in FIG. 6, the front of the single wide base element 100 includes plug receptacles 170 that receive conductive feet 171 extending from the surge protection cartridge 200. The plug receptacles 170 receive the conductive feet 171 to secure the cartridge in its operative position when the cartridge is inserted into the base element 100 via the first receiving section 110*a* to form the SPD 10. Additionally, the plug receptacles 170 are in electrical communication with the contacts 160 to provide electrical communication between the surge protection cartridge 200 and the wire conductors 30, thus incorporating the SPD 10 in the circuit when the cartridge is inserted.

Figure 7:
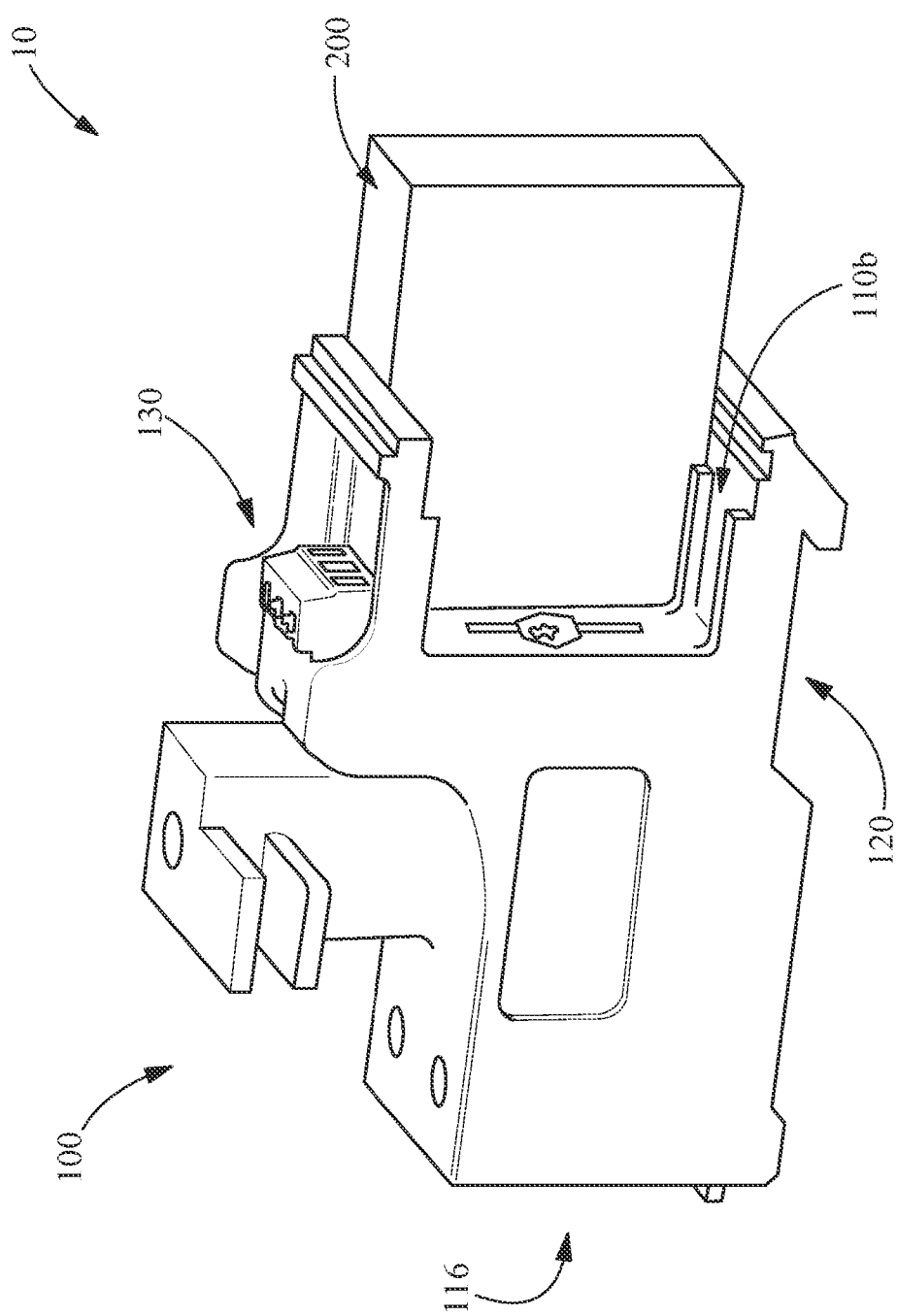
FIG. 7 illustrates a side perspective view of a double wide base element.
Figure 8:
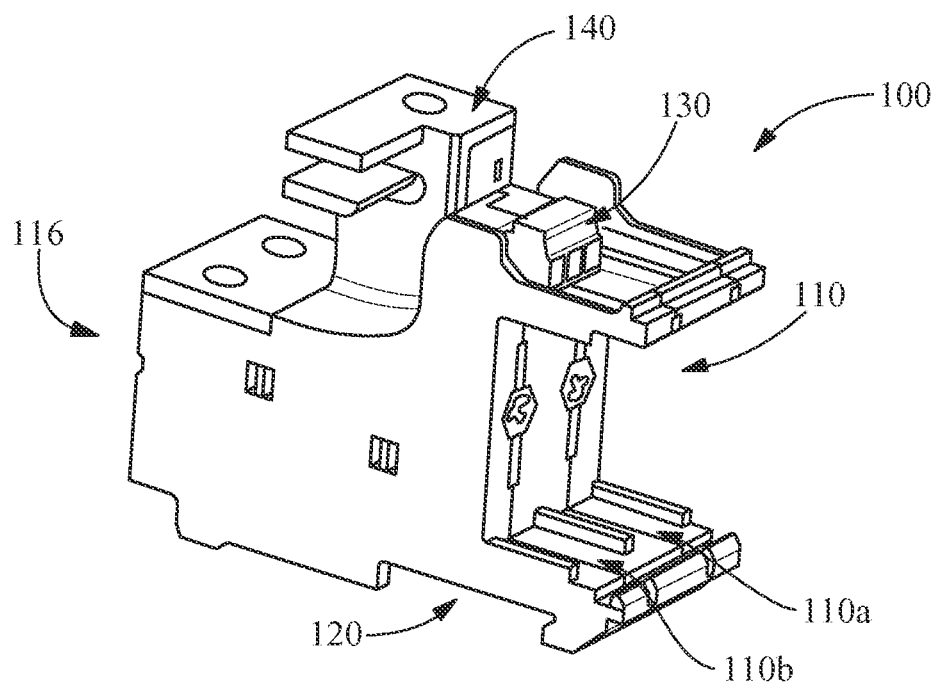
FIG. 8 illustrates a front perspective view of the double wide base element of FIG. 7.

In another embodiment, as shown in FIGS. 7-12, the base element 100 is a double wide (1+1) base element. As best seen in FIGS. 7 and 8, the receiving portion 110 of the double wide base element 100 includes a second receiving section 110*b* for receiving a second cartridge. FIG. 7 shows the surge protection cartridge 200 in the first receiving section 110*a*, with the second receiving section 110*b* left empty for purposes of illustration. When the double wide base element 100 is orthogonally mounted to the DIN rail 40 the first receiving section 110*a* and the second receiving section 110*b* are oriented to receive a single cartridge along the 2 RU height of the case 50 and up to two cartridges along the width of the case 50. Other embodiments may include additional receiving sections in the receiving portion 110, the additional receiving sections oriented to receive additional cartridges along the width of the case 50. It will be appreciated that in some embodiments, the surge protection system may employ only a single cartridge and/or a single unit formed from multiple cartridges, the single unit sized to fit across more than one receiving section (e.g., both the first and second receiving sections 110*a*, 110*b*).

Figure 9:
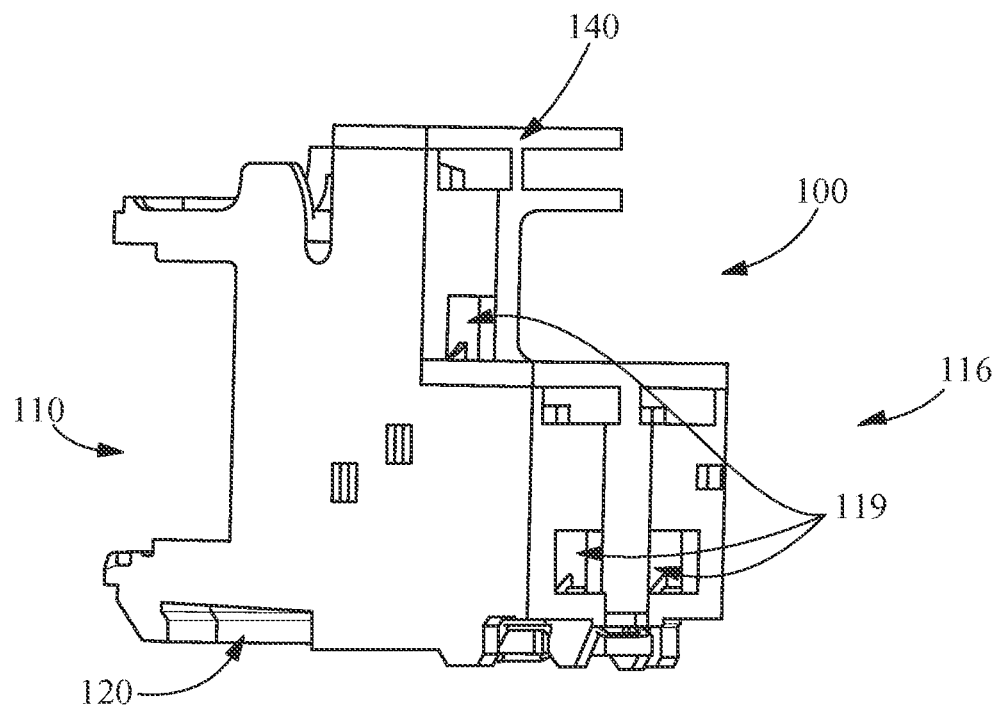
FIG. 9 illustrates a rear perspective view of the double wide base element of FIG. 7.
Figure 10:
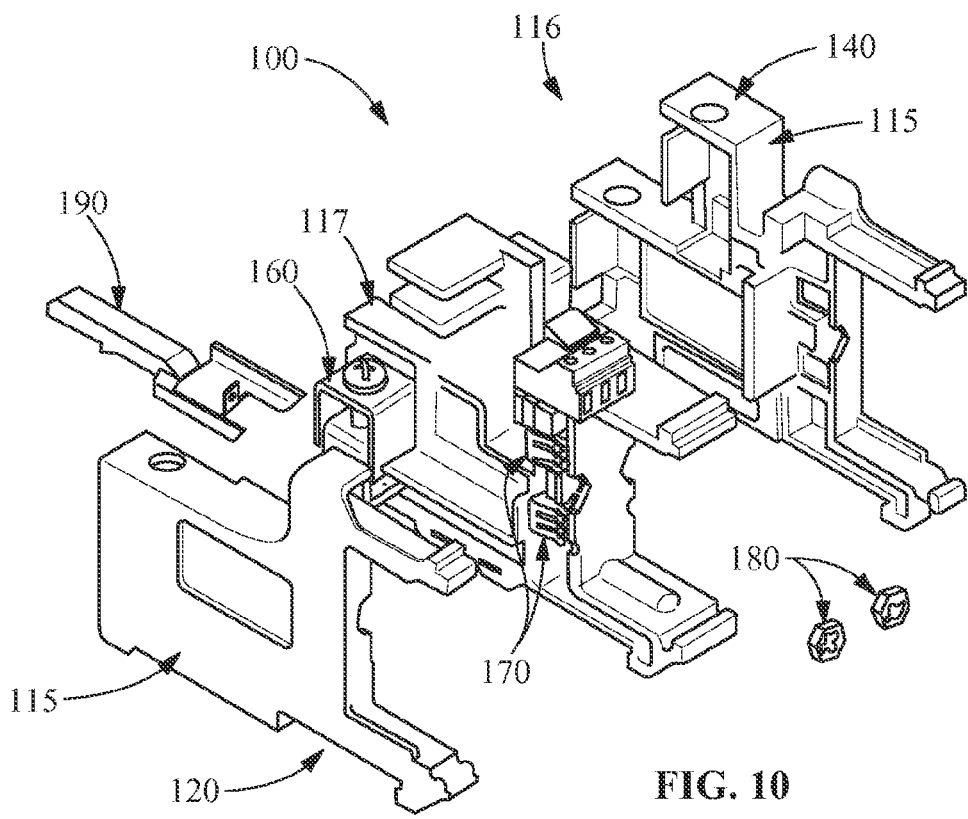
FIG. 10 illustrates an exploded front perspective view of the double wide base element of FIG. 7.
Figure 11:
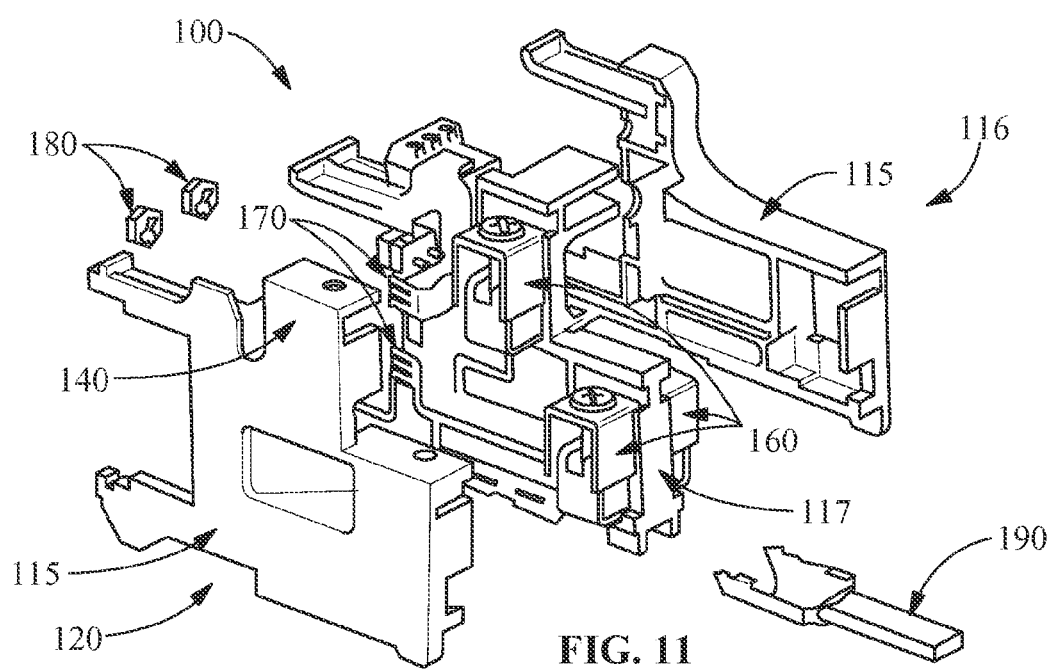
FIG. 11 illustrates an exploded rear perspective view of the double wide base element of FIG. 7.

Referring to FIGS. 9-11, the rear of the double wide base element 100 contains three conductor apertures 119 to provide access to three of the contacts 160 within the base element 100. The contacts 160 support three wire conductors 30: positive, negative, and ground. The position of each of the contacts 160 within the base element may be at any location, but is preferably such that each of the wire conductors 30 can be separately inserted directly into the base element 100 and be secured within the contacts 160.

As illustrated, the double wide base element 100 includes two side housing elements 115 and a central housing element 117. In one embodiment, the two side housing elements 115 are dissimilar, and do not form mirror images of each other. On either side of the central housing element 117, between the two side housing elements 115, the double wide base element 100 includes two of the plug receptacles 170. The plug receptacles 170 on either side receive the conductive feet 171 of the cartridge to provide electrical communication between the surge protection cartridge 200 and the wire conductors 30, and incorporate the SPD 10 in the circuit, as previously discussed.

In one embodiment, a function monitor 130 such as a remote transmitter or other communication device may be employed for remote monitoring of the status of each of the SPDs 10. In another embodiment, a support 140 is formed that extends from the base element 100, the support 140 arranged and disposed to position one or more communication wires that connect the function monitor 130 to a communication port 54 of the enclosure 52 (FIG. 3). The support 140 provides cord management and separates the communication wires from the wire conductors 30, and particularly from the ground conductor, that in the event of a surge condition can prevent the surge from crossing over into the function monitor circuit via the communication wires. Alternatively, the function monitor 130 is positioned such that the communication wires are directed into a space between the enclosure and the perpendicular housing 116, and away from the power wires, for example by being mounted in a trough in the front of the base element 100.

In another embodiment, the base element 100 includes one or more additional features, such as, for example, keying features 180 that help ensure a proper cartridge is inserted into the base element 100 and in the correct direction. As best seen in FIGS. 10 and 11, the base element 100 preferably also includes an attached mounting device 190, such as a spring loaded foot, that urges the base element 100 to a secure position when attached to the DIN rail, thereby resisting lateral forces that may be experienced during service, such as inserting or removing a cartridge.

Figure 12C:
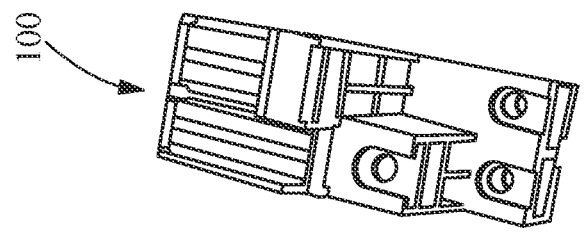
FIG. 12C illustrates a top perspective view of the alternate double wide base element of FIG. 12A.
Figure 12B:
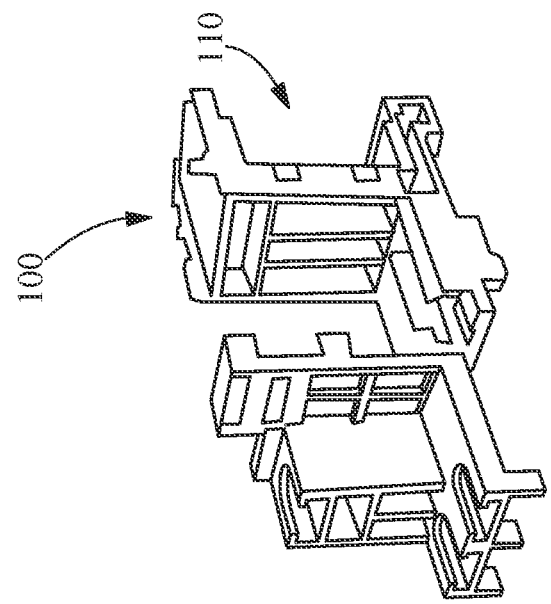
FIG. 12B illustrates an exploded rear perspective view of the alternate double wide base element of FIG. 12A.
Figure 12A:
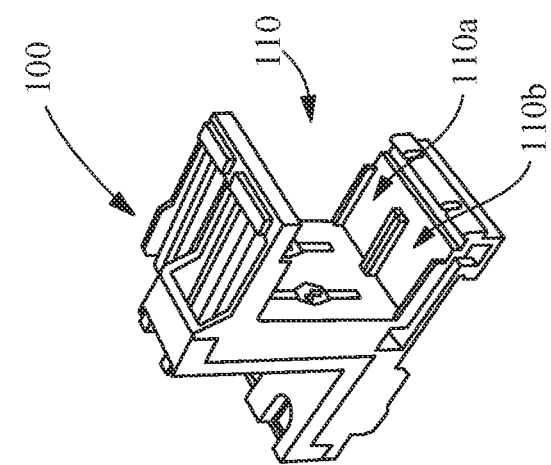
FIG. 12A illustrates a front perspective view of an alternate double wide base element according to an embodiment of the disclosure.

Turning to FIGS. 12A-12C, in an alternative embodiment, the base element 100 includes the double wide base element and is again configured to mount orthogonal to the DIN rail in a rack mount system 56. In this embodiment, the base element 100 is formed of a two-piece housing, having an upper and lower housing. This embodiment further illustrates the manner in which, for example, features such as the function monitor, mounting device (the base element instead being secured to the DIN rail by one or more fasteners), or other optional features may be omitted while still providing a base element that is configured orthogonal to the DIN rail and thus achieves the advantages of being incorporated at increased density as part of a rack mounted surge protection system 56.

Figure 1:
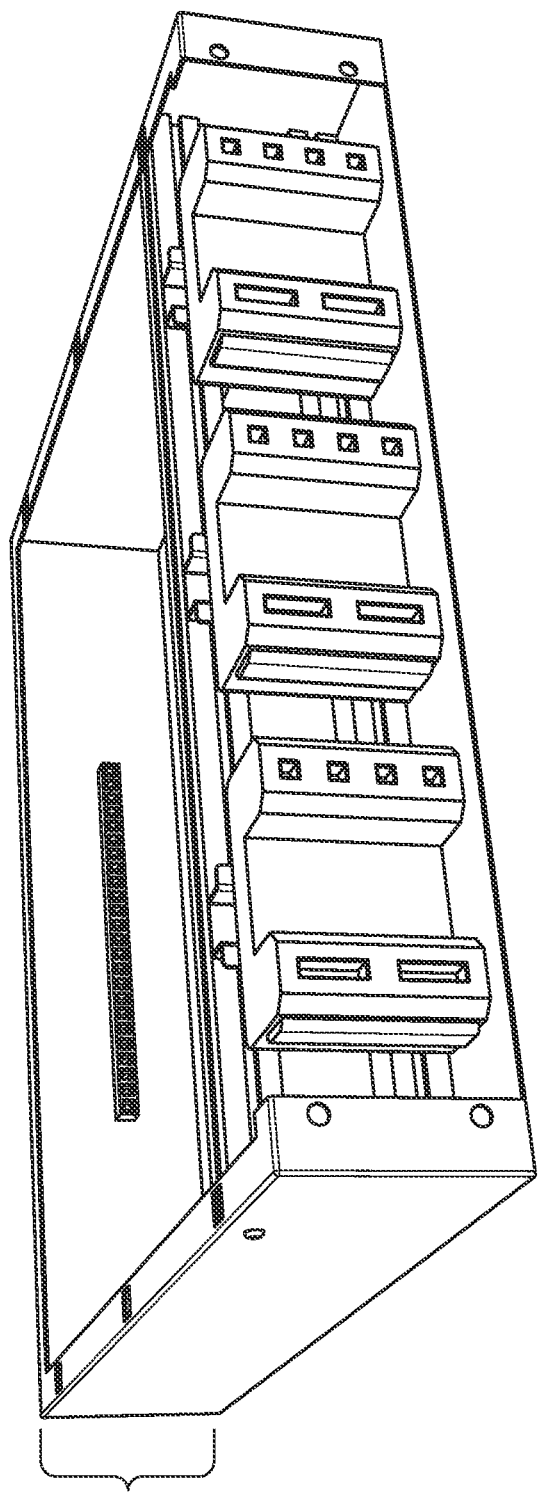
FIG. 1 illustrates a prior art rack mounted surge protection device system providing 6 RRH protection in a 2 RU enclosure.
Figure 2:
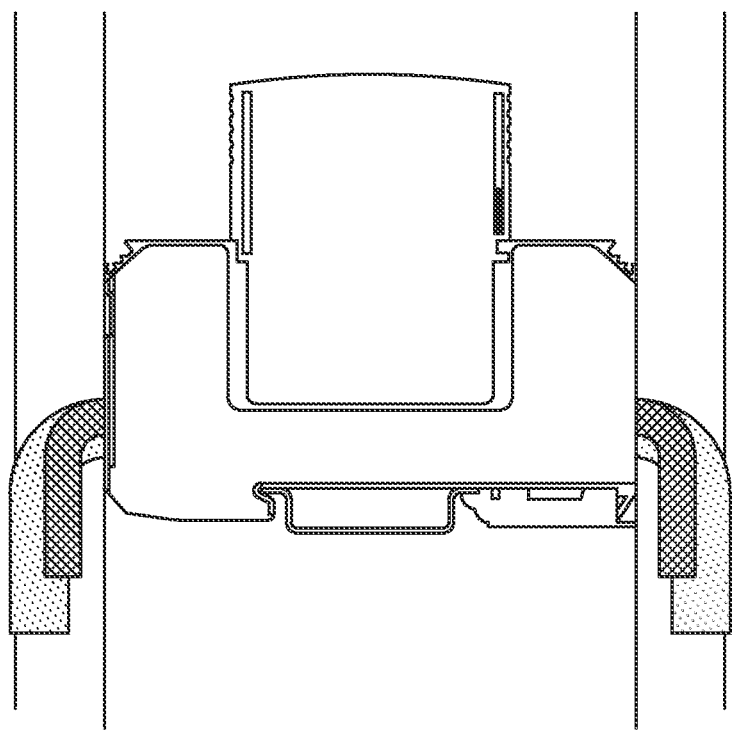
FIG. 2 illustrates a prior art base element having connecting wires bent at an approximately right angle prior to entering an enclosure.

When mounted to the DIN rail, the conductor apertures 119 in the rear of the base element 100 face the enclosure 52 defined by the case 50. The conductor apertures 119 facing the enclosure 52 permit the wire conductors to be directed from an interior of the enclosure 52 into the conductor apertures 119 in a substantially linear manner. For example, in one embodiment, the wire conductors are directed into the conductor apertures 119 in substantially the same axis that the surge protection cartridge 200 is inserted and removed. As a result, sharp bends and the introduction of other stress points are avoided, which reduces or eliminates the mechanical stress found in current solutions previously discussed with respect to FIG. 2, and increases effective performance of the device.

Additionally, the plug receptacles 170 on the front are positioned opposite the conductor apertures 119 on the rear to reduce or eliminate wiring extending from the top, bottom, or side of the base element 100 and thus reduce space requirements of the base element 100. The reduced space requirements of the base element 100 reduce the required height of the case 50, and permit an increased density of the base elements 100 incorporated in the rack mounted SPD system 56. For example, in one embodiment, the reduced space requirements of the base element 100 permit securing a plurality of the base elements 100 to the 19" wide, 2 RU high case 50 to provide twenty-four of the receiving sections 110a, 110b. The plurality of base elements 100 secured to the case 50 include single wide base elements 101, double wide base elements 102, and/or other base elements including additional receiving sections. In a further embodiment, the rack mounted SPD system 56 including twenty-four of the receiving sections 110a, 110b provides 12 RRH protection.

The rack mount SPD system 56 may also include other features contained within the case 50, such as a series of communication ports 54 that may be used to connect the function monitors 130 to the communication circuit. Typically, the bulk of the space within the enclosure 52 may initially be left vacant to accommodate space for the conductors, which are introduced into the enclosure and eventually into the individual SPD 10 for each respective circuit.

In an alternate embodiment, as shown in FIGS. 13-16, the rack mount SPD system 56 includes the case 50 having a height (C-D) of 1 RU, and a base element 105 secured thereto. The base element 105 includes the receiving portion 110 and a 1 RU housing 118 (shown as having two pieces 118a, 118b) configured to be secured within the 1 RU height of the case 50. The receiving portion 110 of the base element 105 includes the first receiving section 110a and the second receiving section 110b. When the base element 105 is mounted to the case 50, the receiving portion 110 is oriented to receive two of the surge protection cartridges 200 along the 1 RU height of the case 50.

Figure 14:
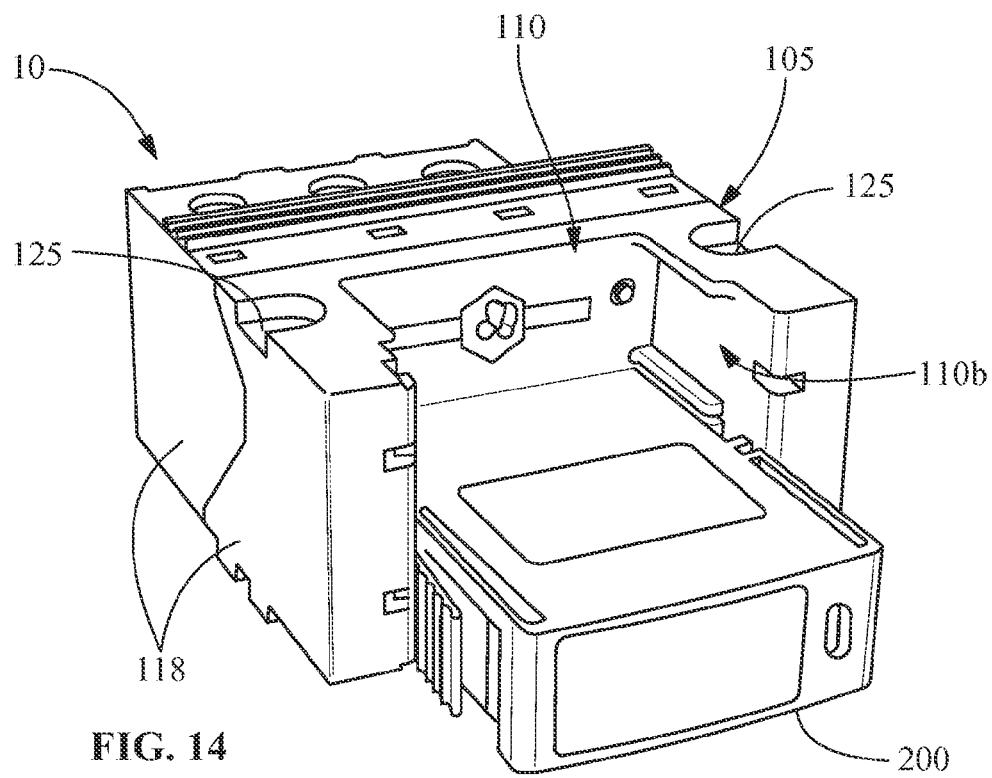
FIG. 14 illustrates a front perspective view of a horizontally oriented base element according to an embodiment of the disclosure.
Figure 15:
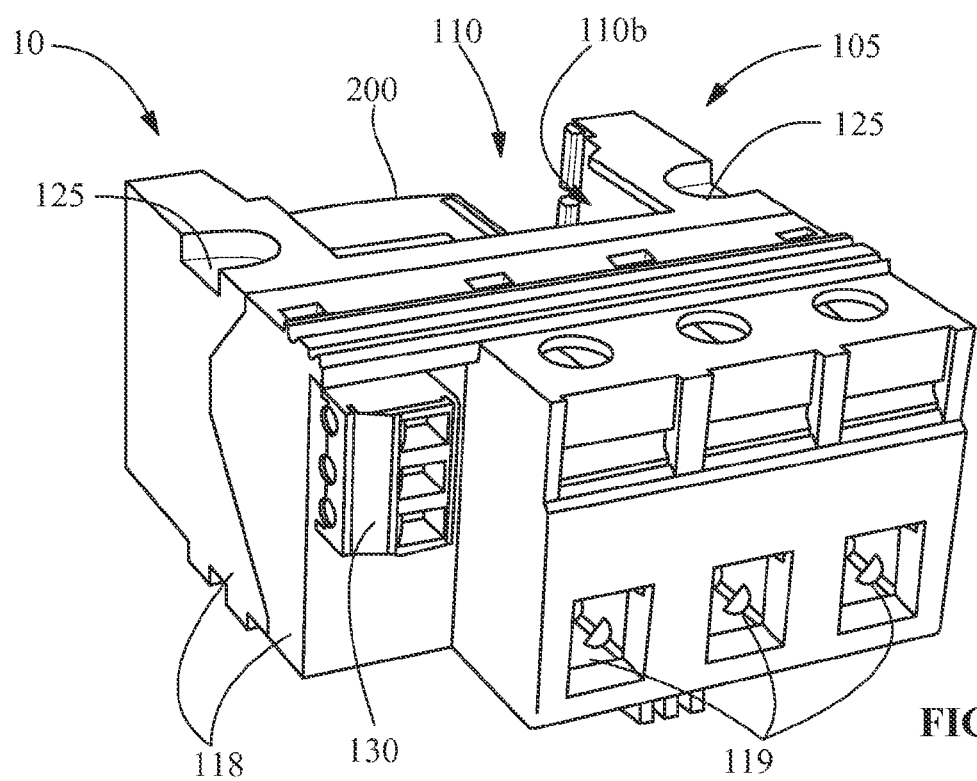
FIG. 15 illustrates a rear perspective view of the horizontally oriented base element of FIG. 14.

FIGS. 14 and 15 show the second receiving section 110b left empty for purposes of illustration. As previously discussed with regard to the double wide base element 102, the surge protection system may employ the single cartridge in one of the receiving sections 110a, 110b, two separate cartridges in the receiving sections 110a, 110b, or the single unit sized to fit across both of the receiving sections 110a, 110b.

In one embodiment, the 1 RU housing 118 of the base element 105 includes through holes 125 for securing the base element 105 to the case 50. Alternatively, the base element 105 may include a DIN rail mating feature, such as the DIN rail receptacle 120 for securing the base element 105 to the DIN rail 40, as discussed with respect to FIG. 5. In another embodiment, slots are provided in the rear of the parallel housing 118 to mate with hook features extending from the case 50 and anchor the base element 105 to the case 50.

Figure 16:
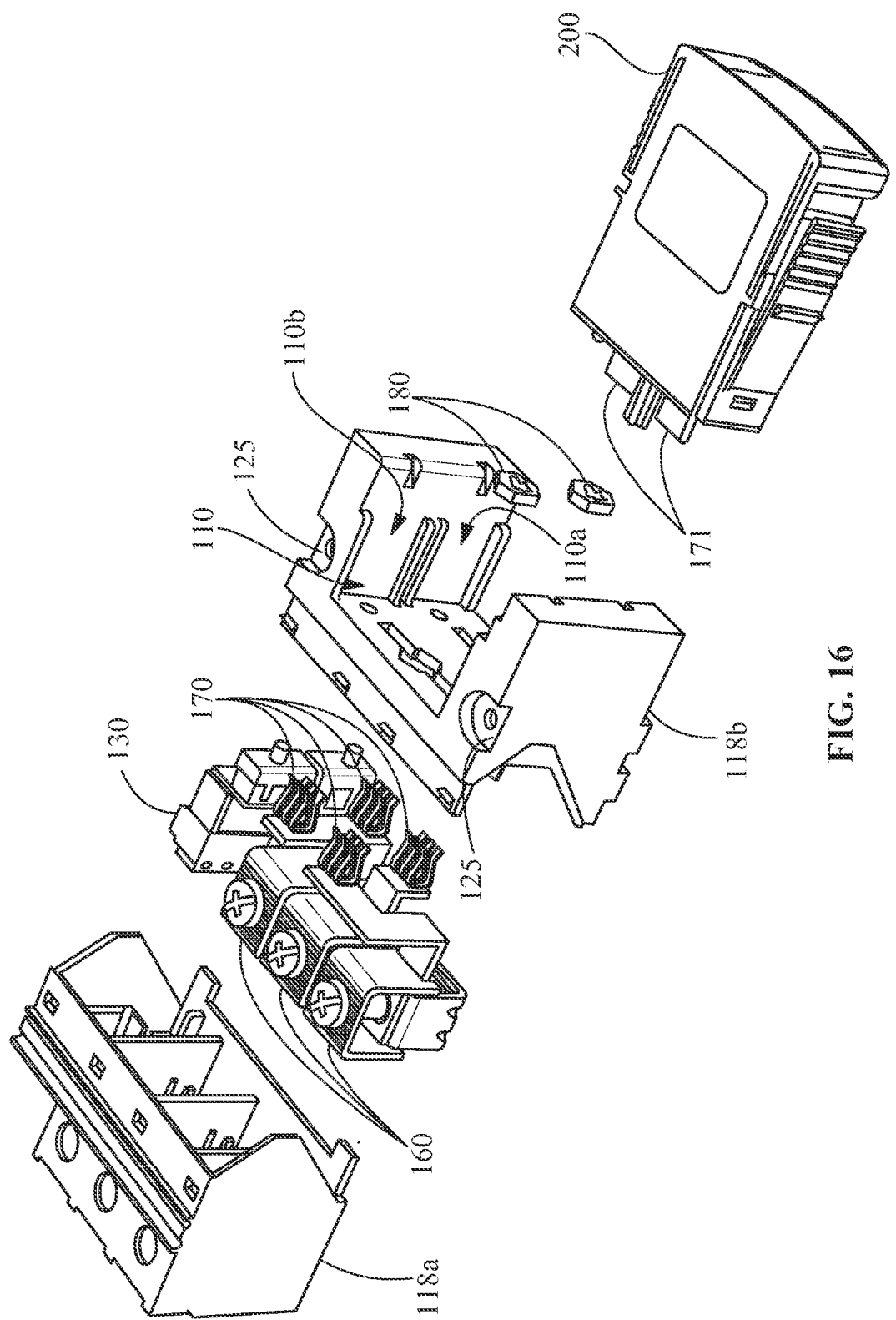
FIG. 16 illustrates an exploded perspective view of the horizontally oriented base element of FIG. 14.

As shown in FIGS. 15-16, three conductor apertures 119 are included on the rear of the base element 105, and two plug receptacles 170 are provided on the front of the base element 105 for each of the receiving sections 110a, 110b. To provide electrical communication between the surge protection cartridge 200 and the wire conductors, the base element 105 includes three contacts 160. The contacts 160 are in electrical communication with the plug receptacles 170 and accessible through the conductor apertures 119 on the rear of the base element 105. In one embodiment, two plug receptacles 170 are connected in common to one contact 160 to provide line-to-neutral and neutral-to-ground protection.

Figure 13:
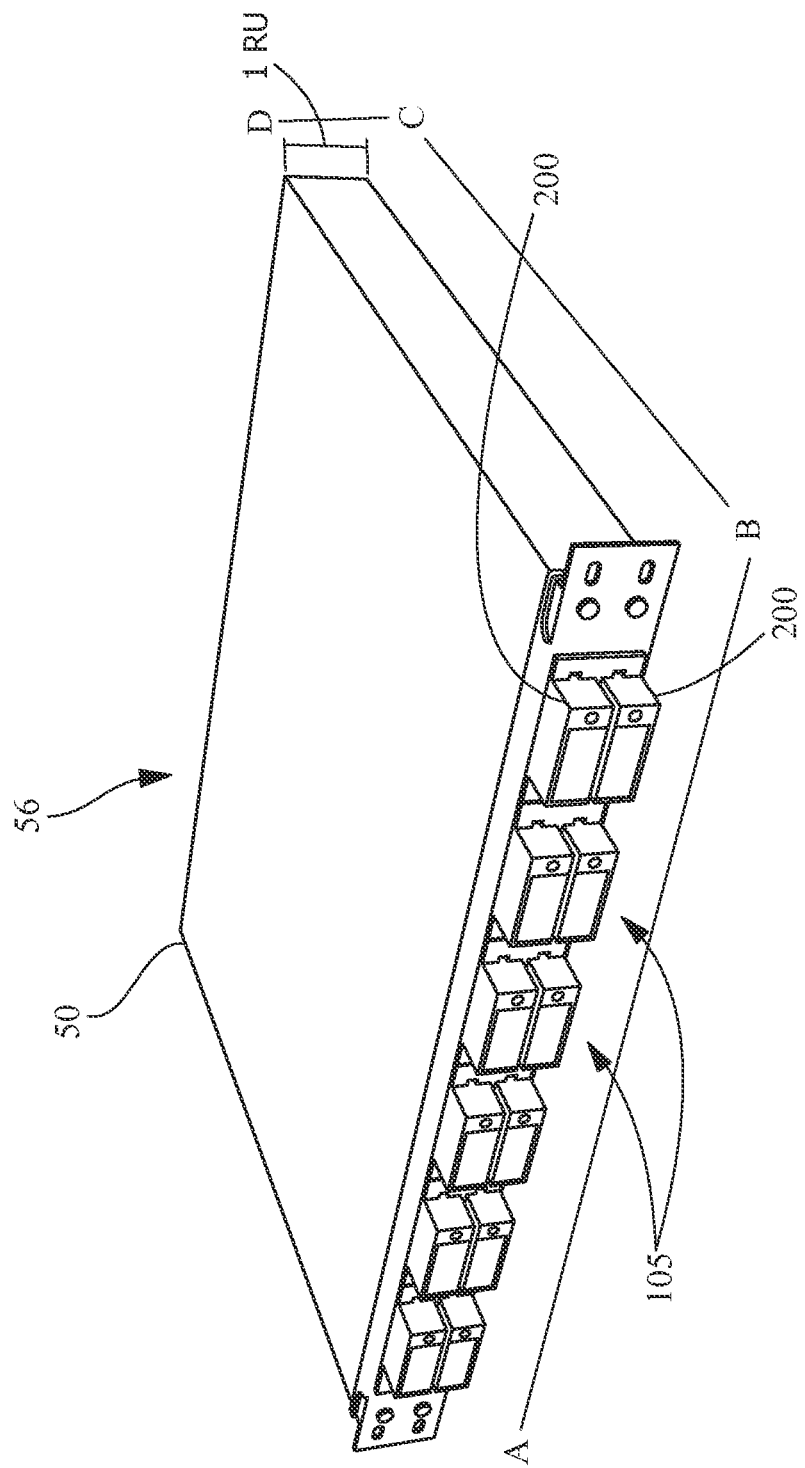
FIG. 13 illustrates a perspective view of a 1 RU enclosure according to an embodiment of the disclosure.

When the base element 105 is secured to the case 50, the conductor apertures 119 in the rear of the base element 105 face the enclosure 52 defined by the case 50 to permit the wire conductors to be directed into the conductor apertures 119 in a substantially linear manner. As previously discussed, directing the wire conductors into the conductor apertures 119 in a substantially linear manner reduces or eliminates the mechanical stress, increases effective performance of the device, reduces or eliminates wiring extending from the top, bottom, or side of the base element 105 to reduce space requirements of the base element 105, and/or permits incorporating an increased density of the base elements 105 in the rack mounted SPD system 56. For example, in one embodiment, as shown in FIG. 13, up to six of the base elements 105 are secured to the case 50 having the 1 RU height to provide up to twelve receiving sections 110a, 110b. The twelve receiving sections 110a, 110b provide six RRH protection. In other embodiments the base element 105 also includes other features, such as, but not limited to, those previously discussed with regard to the base element 100 shown in FIGS. 3-12.

While shown and described with respect to certain applications relating to RRH protection, it will be appreciated that exemplary embodiments are not so limited and that other applications are contemplated in which exemplary embodiments may also be employed.

While the foregoing specification illustrates and describes exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A rack mount surge protection system, comprising:
   an enclosure formed by a case configured to be attached to a rack mount system; and
   a plurality of base elements of a pluggable surge protection device secured to the case, each of the base elements comprising:
   a receiving portion extending from a front portion of the base element and arranged to receive a surge protection cartridge from the front of the case;
   contacts within the base element for securing wire conductors therein; and
   apertures in a rear portion of the base element to provide access to the contacts;
   wherein the wire conductors extend from the enclosure through the apertures and into the contacts in a substantially linear manner in registration with the direction that the receiving portion receives the surge protection cartridge.

2. The system of claim 1, wherein the base elements are selected from the group consisting of single wide base elements and double wide base elements.

3. The system of claim 2, wherein the case comprises a height of 2 RU and the base elements secured to the case provide twenty-four receiving sections.

4. The system of claim 3, wherein the twenty-four receiving sections provide twelve remote radio head protection.

5. The system of claim 3, wherein the base elements further comprise a DIN rail receptacle, the DIN rail receptacle configured to mount the base elements orthogonal to a DIN rail in the case.

6. The system of claim 2, wherein the case comprises a height of 1 RU and the base elements secured to the case provide twelve receiving sections.

7. The system of claim 1, wherein the surge protection device further comprises a plurality of removable surge protection cartridges, wherein the cartridges are accessible via a front face of the enclosure.

8. The system of claim 7, wherein a front portion of each of the base elements includes plug receptacles for receiving and securing conductive feet extending from each of the removable surge protection cartridges.

9. The system of claim 8, wherein the plug receptacles are in electrical communication with the contacts to incorporate the surge protection device in a circuit when the wire conductors are secured in the contacts and the conductive feet are inserted into the plug receptacles.

10. The system of claim 8, wherein two of the plug receptacles are commonly electrically connected to one of the contacts to provide line-to-neutral and neutral-to-ground protection.

11. The system of claim 1, wherein at least one of the base elements further comprises a function monitor connected to a communication port of the case with one or more communication wires.

12. The system of claim 11, further comprising a support extending from at least one of the base elements, the support arranged and disposed to separate the one or more communication wires from the wire conductors.

* * * * *